(12) United States Patent
Wu et al.

(10) Patent No.: US 9,137,902 B2
(45) Date of Patent: Sep. 15, 2015

(54) PROCESS TO FORM HIGHLY CONDUCTIVE FEATURE FROM SILVER NANOPARTICLES WITH REDUCED PROCESSING TEMPERATURE

(75) Inventors: Yiliang Wu, Oakville (CA); Ping Liu, Mississauga (CA); Nan-Xing Hu, Oakville (CA)

(73) Assignee: XEROX CORPORATION, Norwalk, CT (US)

( * ) Notice: Subject to any disclaimer, the term of this patent is extended or adjusted under 35 U.S.C. 154(b) by 1061 days.

(21) Appl. No.: 12/541,644

(22) Filed: Aug. 14, 2009

(65) Prior Publication Data

US 2011/0039096 A1 Feb. 17, 2011

(51) Int. Cl.
| | |
|---|---|
| *B32B 5/00* | (2006.01) |
| *H05K 3/12* | (2006.01) |
| *C09D 11/52* | (2014.01) |
| *C23C 24/08* | (2006.01) |
| *C23C 26/00* | (2006.01) |
| *H05K 1/09* | (2006.01) |

(52) U.S. Cl.
CPC .............. *H05K 3/1283* (2013.01); *C09D 11/52* (2013.01); *C23C 24/08* (2013.01); *C23C 26/00* (2013.01); *H05K 1/097* (2013.01); *H05K 2203/0789* (2013.01); *H05K 2203/1131* (2013.01); *H05K 2203/122* (2013.01); *Y10T 428/265* (2015.01); *Y10T 428/31504* (2015.04)

(58) Field of Classification Search
CPC ... H01L 21/702; H01L 21/705; H01L 21/707; H01L 21/76838; B22F 1/025; B22F 2201/01; B22F 2301/25; B22F 2301/255
USPC ............................ 427/126.1, 126.2, 126.5, 58
See application file for complete search history.

(56) References Cited

U.S. PATENT DOCUMENTS

| | | | | |
|---|---|---|---|---|
| 6,306,204 | B1* | 10/2001 | Lin | 106/31.43 |
| 2003/0160235 | A1* | 8/2003 | Hirai | 257/40 |
| 2003/0180451 | A1* | 9/2003 | Kodas et al. | 427/123 |
| 2005/0129843 | A1* | 6/2005 | Wu et al. | 427/180 |
| 2006/0001726 | A1* | 1/2006 | Kodas et al. | 347/105 |
| 2006/0073667 | A1* | 4/2006 | Li et al. | 438/311 |
| 2008/0113195 | A1* | 5/2008 | Boll et al. | 428/401 |
| 2008/0124238 | A1* | 5/2008 | Atsuki et al. | 419/10 |
| 2008/0160183 | A1 | 7/2008 | Ide et al. | |
| 2009/0148600 | A1 | 6/2009 | Li et al. | |
| 2010/0034693 | A1* | 2/2010 | Li | 420/501 |

(Continued)

FOREIGN PATENT DOCUMENTS

| | | |
|---|---|---|
| CA | 2648536 | 7/2009 |
| CA | 2694777 | 9/2010 |

(Continued)

OTHER PUBLICATIONS

R. Williams p. 1 pKa Values Index, research.chem.psu.edu/brpgroup/pKa_compilation.pdf.*

(Continued)

*Primary Examiner* — Michael Cleveland
*Assistant Examiner* — Tabassom Tadayyon Eslami
(74) *Attorney, Agent, or Firm* — MH2 Technology Law Group LLP

(57) ABSTRACT

Exemplary embodiments provide materials and methods for forming highly-conductive features including stabilized silver-containing nanoparticles at low processing temperatures of no more than about 140° C.

20 Claims, 5 Drawing Sheets

(56) References Cited

U.S. PATENT DOCUMENTS

2010/0151633 A1* 6/2010 Wu et al. .................. 438/149
2010/0224837 A1* 9/2010 Wu et al. .................. 252/514
2010/0226811 A1* 9/2010 Wu et al. .................. 419/26

FOREIGN PATENT DOCUMENTS

| CN | 1478285 | 2/2004 |
| CN | 1608296 | 4/2005 |
| CN | 101157127 | 4/2008 |
| EP | 1646095 | 4/2006 |
| EP | 1881750 | 1/2008 |
| EP | 2228155 | 9/2010 |
| JP | 2006-169613 A | 6/2006 |
| WO | 2009/054453 | 4/2009 |

OTHER PUBLICATIONS http://en.wikipedia.org/wiki/Acetic_acid.*
pKa Data Compiled by R. Williams p. 1 pKa Values Index, research.chem.psu.edu/brpgroup/pKa_compilation.pdf, No Date.*
http://en.wikipedia.org/wiki/Acetic_acid, No Date.*
European Patent Office, European Search Report, European Patent Application No. 10172593.5, Dec. 13, 2010, 9 Pages.
Communication dated Apr. 24, 2014 from Canadian Patent Application No. 2,712,306, pp. 1-3.
Translation of Japanese Office Action dated Apr. 15, 2014, Japanese Application No. 2010-181695, pp. 1-5.

* cited by examiner

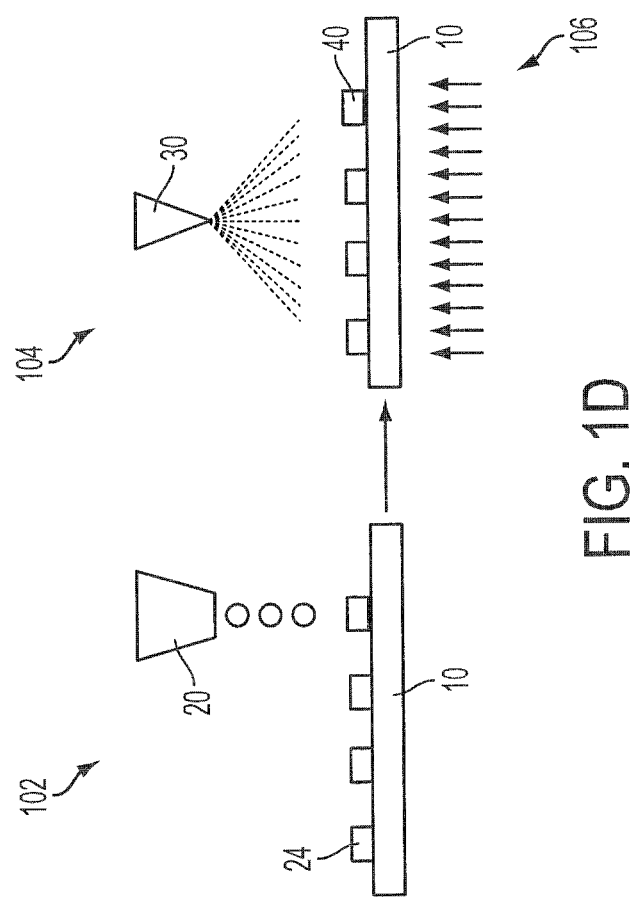

PROCESS TO FORM HIGHLY CONDUCTIVE FEATURE FROM SILVER NANOPARTICLES WITH REDUCED PROCESSING TEMPERATURE

DETAILED DESCRIRTION

1. Field of Use

The present teachings relate generally to conductive features and, more particularly, to highly conductive features including silver-containing nanoparticles and processes for their formation at low temperatures.

2. Background

Silver nanoparticies have attracted extensive interests for use as printable conductive materials and as highly conductive features of electronic devices. This is because silver is much lower in cost than gold and possesses much better environmental stability than copper. Conventional methods for forming highly conductive features containing silver nanoparticles on a substrate include two steps. The first step includes depositing a liquid composition containing silver nanoparticles into a composition feature on a substrate. The second step includes heating the deposited feature to form a highly conductive feature During the conventional processes, large or bulky stabilizers are often used in order to stabilize silver-containing nanoparticles. This usually results in high heating temperature and long heating time at the second step, which are not compatible with plastic substrate such as polyethylene terephthalate (PET), and the like. For example, PET substrates may be dimensionally deformed or chemically degraded when high heating temperatures are used especially for a long time.

Thus, there is a need to overcome these and other problems of the prior art and to form highly conductive features including silver-containing nanoparticles by a process that uses a reduced heating temperature.

SUMMARY

According to various embodiments, the present teachings include a method for forming a highly conductive feature. The highly conductive feature can be formed by first depositing a liquid composition having a plurality of silver-containing nanoparticles into a composition feature on a substrate, followed by a heating step of the composition feature. During the formation process, a composition agent can be applied to the composition feature, for example, at a step selected from during the depositing step, after the depositing step but prior to the heating step, and during the heating step. The application of the composition agent to the composition feature can allow a reduced temperature for the heating step.

According to various embodiments, the present teachings also include a method for forming a highly conductive feature. The formation process can include first depositing a liquid composition having a plurality of organoamine-stabilized silver-containing nanoparticles into a composition feature on a flexible substrate and then heating the composition feature at a temperature of about 140° C. or lower. During the formation process, an acidic composition can be applied to the composition feature, for example, at a step selected from the group consisting of the depositing step, a step after the depositing step but prior to the heating step, and the heating step.

According to various embodiments, the present teachings further include a method for forming a highly conductive feature. The formation process can include first depositing a liquid composition having a plurality of organoamine-stabilized silver-containing nanoparticles into one or more composition features on a substrate including a material of, for example, PET (polyethylene terephthalate); then annealing the one or more composition features at a temperature of about 120° C. or lower; and then applying an acidic composition to the one or more composition features. In embodiments, the acidic composition can be applied at a step selected from the group consisting of the depositing step, a step after the depositing step but prior to the heating step, and the heating step.

Additional objects and advantages of the present teachings will be set forth in part in the description which follows, and in part will be obvious from the description, or may be learned by practice of the present teachings. The objects and advantages of the present teachings will be realized and attained by means of the elements and combinations particularly pointed out in the appended claims.

It is to be understood that both the foregoing general description and the following detailed description are exemplary and explanatory only and are not restrictive of the present teachings, as claimed.

BRIEF DESCRIPTION OF THE DRAWINGS

The accompanying drawings, which are incorporated in and constitute a part of this specification, illustrate several embodiments of the present teachings and together with the description, serve to explain the principles of the present teachings.

FIG. 1D depicts cross sectional schematics for forming an additional exemplary highly conductive features in accordance with various embodiments of the present teachings.

Figure 1A:
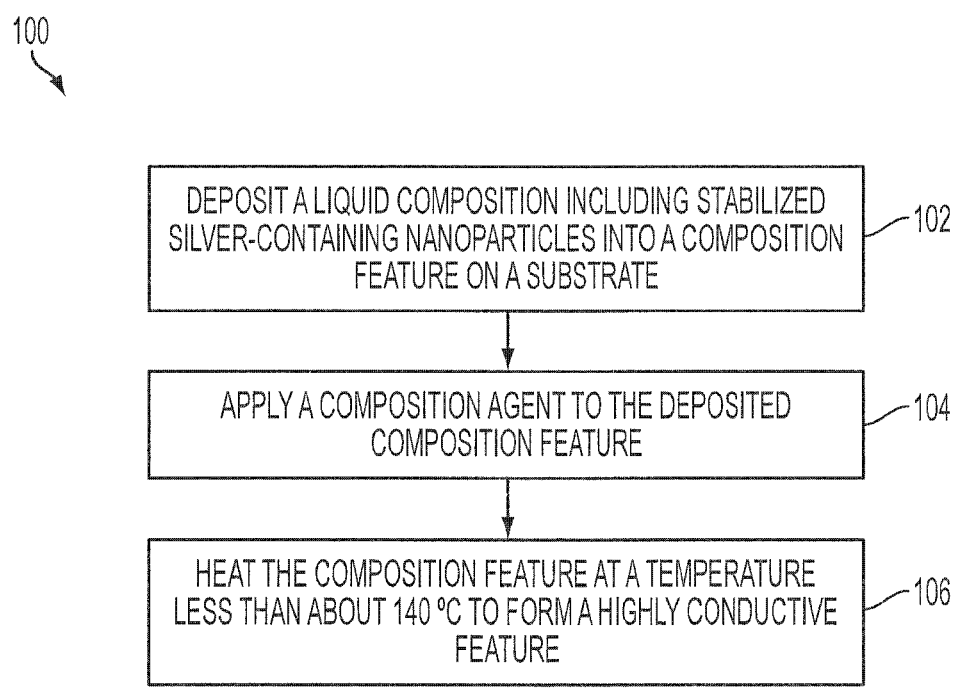
FIG. 1A depicts an exemplary method for forming a highly conductive feature in accordance with various embodiments of the present teachings.

It should be noted that some details of the FIGS. have been simplified and are drawn to facilitate understanding of the embodiments rather than to maintain strict structural accuracy, detail, and scale.

DESCRIPTION OF THE EMBODIMENTS

Reference will now be made in detail to embodiments of the present teachings, examples of which are illustrated in the accompanying drawings. Wherever possible, the same reference numbers will be used throughout the drawings to refer to the same or like parts.

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely exemplary.

Exemplary embodiments provide materials and methods for forming highly conductive features including stabilized silver-containing nanoparticles at reduced processing temperatures of less than about 140° C., or in some cases, less than about 120° C. In one embodiment, highly conductive features can be formed on a substrate by annealing composition features that are treated by related composition agents.

The related composition agents can include, e.g., an acidic composition and/or a base composition depending on the stabilizer used to stabilize the silver-containing nanoparticles. In embodiments, without limited to any particular theory, the related composition agents can be capable of forming a chemical bond and/or a physical attachment to the stabilizer forming a weak network, a complex, and/or a salt form on surfaces of the silver-containing nanoparticles such that a lower temperature can be used to, for example, thermally dissociate the stabilizer from the stabilized silver-containing nanoparticles.

In embodiments, one or more stabilizers, such as organoamines or other stabilizers, can be attached to the surface of the silver-containing nanoparticles to form the stabilized silver-containing nanoparticles.

Stabilizer can have the function of minimizing or preventing the silver-containing nanoparticles from aggregation in a liquid and optionally providing the solubility or dispersibility of silver-containing nanoparticles in a liquid. In addition, the stabilizer can be thermally removable which means that the stabilizer can be caused to dissociate from the silver-containing nanoparticle surface under certain conditions such as through heating or annealing. In embodiments, the thermal dissociation of the stabilizer from the silver-containing nanoparticles at such temperatures can result in the evaporation of the stabilizer or decomposition of the stabilizer into gaseous forms.

In embodiments, the stabilizer may be an organic stabilizer. Exemplary organic stabilizers can include thiol and its derivatives, amine and its derivatives, carboxylic acid and its carboxylate derivatives, polyethylene glycols, and other organic surfactants. In embodiments, the organic stabilizer can be selected from the group consisting of a thiol such as for example butanethiol, pentanethiol, hexanethiol, heptanethiol, octanethiol, decanethiol, and dodecanethiol; an amine such as for example ethylamine, propylamine, butylamine, penylamine, hexylamine, heptylamine, octylamine, nonylamine, decylamine, and dodecylamine; a dithiol such as for example 1,2-ethanedithiol, 1,3-propanedithiol, and 1,4-butanedithiol; a diamine such as for example ethylenediamine, 1,3-diaminopropane, 1,4-diaminobutane; a mixture of a thiol and a dithiol; and a mixture of an amine and a diamine. Organic stabilizers containing a pyridine derivative (e.g., dodecyl pyridine) and/or organophosphine that can stabilize silver-containing nanoparticles can also be included as a stabilizer in embodiments of the present invention.

In various embodiments, the stabilizer can be an organoamine including, such as, for example, butylamine, penylamine, hexylamine, heptylamine, octylamine, nonylamine, decylamine, hexadecylamine, undecylamine, dodecylamine, tridecylamine, tetradecylamine, diaminopentane, diaminohexane, diaminoheptane, diaminooctane, diaminononane, diaminodecane, diaminooctane, dipropylamine, dibutylamine, dipentylamine, dihexylamine, diheptylamine, dioctylamine, dinonylamine, didecylamine, hexyldecane amine, methylpropylamine, ethylpropylamine, propylbutylamine, ethylbutylamine, ethylpentylamine, propylpentylamine, butylpentylamine, tributylamine, trihexylamine, and the like, or mixtures thereof. One or more stabilizers can be used for the disclosed stabilized silver-containing nanoparticles.

In embodiments, the stabilizer can interact with the silver-containing nanoparticles by a chemical bond and/or a physical attachment. The chemical bond can take the form of, for example, covalent bonding, hydrogen bonding, coordination complex bonding, or ionic bonding, or a mixture of different chemical bondings. The physical attachment can take the form of, for example, van der Waals' forces or dipole-dipole interaction, or a mixture of different physical attachments.

The extent of the coverage of stabilizer on the surface of the silver-containing nanoparticles can vary, for example, from partial to full coverage depending, for example, on the capability of the stabilizer to stabilize the silver-containing nanoparticles in the solvent. Various extent of coverage of the stabilizer among the individual silver-containing nanoparticles can be used for the stabilized silver-containing nanoparticles.

In various embodiments, the silver-containing nanoparticles can have an average particle size of, for example, less than about 100 nm, less than about 50 nm, less than about 25 nm, or less than about 10 nm. The particle size can be defined herein as the average diameter of silver-containing particle core, excluding the stabilizer.

In various embodiments, the silver-containing nanoparticles can include elemental silver or silver composites. Besides silver, the silver composite can include either or both of (i) one or more other metals and (ii) one or more non-metals. Suitable other metals can include, for example, Al, Au, Pt, Pd, Cu, Co, Cr, In, and Ni, particularly the transition metals, for example Au, Pt, Pd, Cu, Cr, Ni, and mixtures thereof. Exemplary metal composites can include Au—Ag, Ag—Cu, Au—Ag—Cu, and Au—Ag—Pd. Suitable non-metals in the metal composite can include, for example, Si, C, Ge or their combinations.

The various components of the silver composite can be present in an amount ranging, for example, from about 0.01% to about 99.9% by weight, or in some cases, ranging from about 10% to about 90% by weight of total silver-containing nanoparticles. In embodiments, the silver composite can be a metal alloy including silver and other metals, with silver including, for example, at least about 20% of the nanoparticles by weight, or in some cases greater than about 50% of the nanoparticles by weight. Unless otherwise noted, the weight percentages recited herein for the components of the silver-containing nanoparticles do not include the stabilizer.

In various embodiments, the stabilizers, such as organoamines, can be present in an amount ranging from about 5 weight percent to about 60 weight percent, from about 10 weight percent to about 40 weight percent, or from about 15 weight percent to about 30 weight percent of the total weight of the nanoparticles and the stabilizers, i.e., the organoamine-stabilzed silver-containing nanoparticles.

As disclosed herein, the term "highly conductive feature" refers to a conductive feature having an electrical conductivity of at least about 0.1 Siemens/centimeter ("S/cm"), at least about 100 S/cm, at least about 500 S/cm, at least about 1,000 S/cm, at least about 5,000 S/cm, at least about 10,000 S/cm, or at least about 20,000 S/cm as measured by, e.g., four-point probe method.

In embodiments, the highly conductive feature can have a thickness ranging, for example, from about 5 nanometers to about 5 millimeters, or in some cases, ranging from about 10 nanometers to about 1000 micrometers including, for example, from about 50 nanometers to about 10 micrometers including, from about 60 nanometers to about 5 micrometers, or 80 nanometers to about 1 micrometers.

In embodiments, the highly conductive features can be used as printable conductive materials or used for electronic devices. For example, the highly conductive features can be used in a variety of applications including, but not limited to, conductive electrodes, conductive pads, conductive traces, conductive lines, conductive tracks, and the like in electronic devices. The phrase "electronic device" refers to macro-, micro- and nano-electronic devices such as thin film transistor, organic light emitting diodes, RFID tags, photovoltaic, printed circuit board, and other electronic devices which require conductive elements or components.

In embodiments, the disclosed low-temperature annealing can allow highly conductive features to be formed on, e.g., flexible substrate, such as PET (polyethylene terephthalate). As used herein, the term "flexible substrate" refers to a substrate made of a polymer, a plastic, a rubber or the like. The "flexible substrate" can undergo deformation in dimension and/or chemical degradation at a high temperature, for example, higher than 140° C. The low-temperature processing can thus maintain dimension stability of such substrate. In an exemplary embodiment, a processing temperature of about 120° C. or lower can be desirable for large-area applications.

Figure 1B:
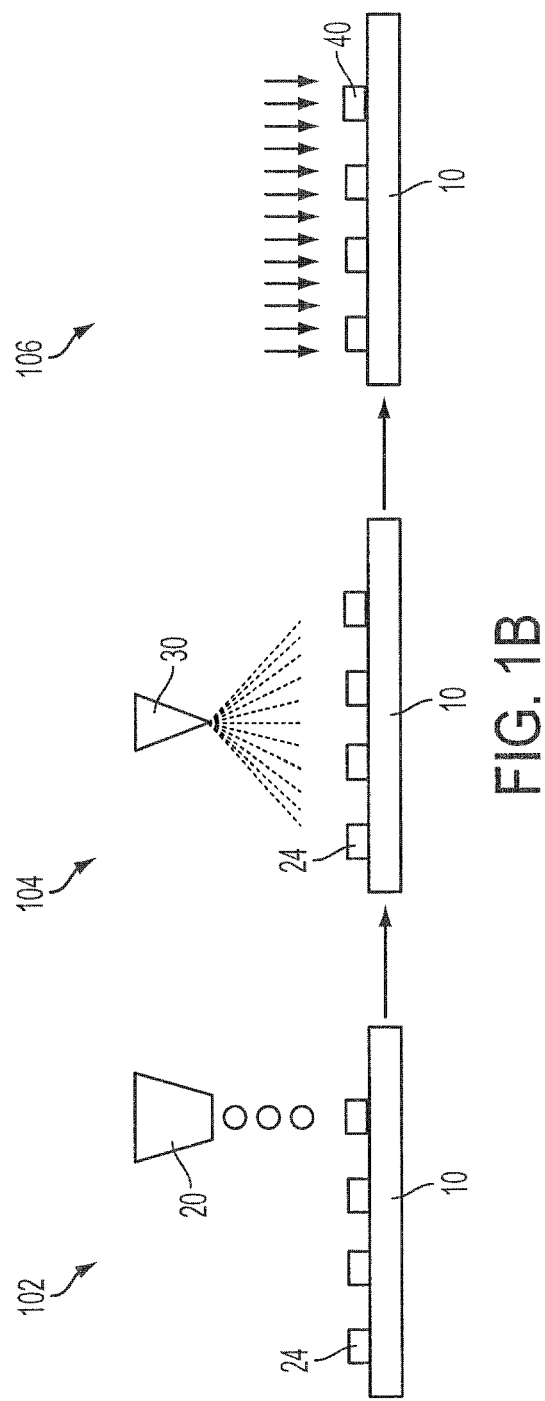
FIG. 1B depicts cross sectional schematics for forming an exemplary highly conductive features in accordance with various embodiments of the present teachings.
Figure 1C:
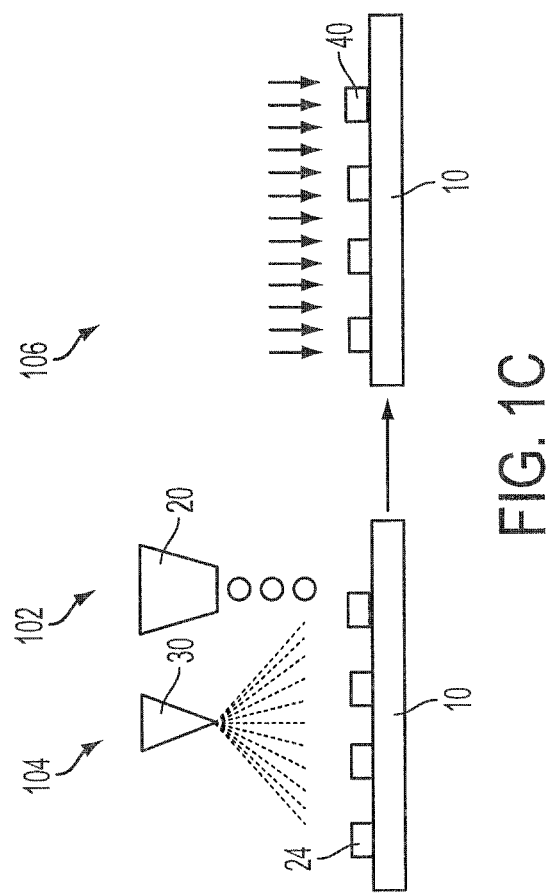
FIG. 1C depicts cross sectional schematics for forming another exemplary highly conductive features in accordance with various embodiments of the present teachings.

FIG. 1A depicts an exemplary method 100 for forming a highly conductive feature, while FIGS. 1B-1D depict cross sectional schematics for forming various exemplary highly conductive features in accordance with various embodiments of the present teachings. In embodiments, although the method 100 of FIG. 1A will be described in reference to FIGS. 1B-1D for illustrative purposes, the process of method 100 of FIG. 1A is not limited to the structures shown in FIGS. 1B-1D.

In addition, while the method 100 of FIG. 1A is illustrated and described below as a series of acts or events, it will be appreciated that the present invention is not limited by the illustrated ordering of such acts or events. For example, some acts may occur in different orders and/or concurrently with other acts or events apart from those illustrated and/or described herein. Also, not all illustrated steps may be required to implement a methodology in accordance with one or more aspects or embodiments of the present invention. Further, one or more of the acts depicted herein may be carried out in one or more separate acts and/or phases.

At 102 of FIG. 1A, and referring to FIG. 1B, a liquid composition 20 that includes stabilized silver-containing nanoparticles can be deposited into a composition feature 24 on a substrate 10.

In various embodiments, the substrate 10 can include glass, polyimide, poly(ethylene naphthalate) (PEN), PET or the like. In one embodiment, the substrate 10 can be any substrate stable at low temperatures, such as less than about 140° C., or in some cases, less than about 120° C.

As disclosed herein, the liquid composition 20 that includes stabilized silver-containing nanoparticles can also include suitable solvents, such as, water, hydrocarbon solvent, alcohol, ketone, chlorinated solvent, ester, ether, and the like. Suitable hydrocarbon solvent can include an aliphatic hydrocarbon having at least 5 carbon atoms to about 20 carbon atoms, such as pentane, hexane, heptane, octane, nonane, decane, undecane, dodecane, tridecane, tetradecane, pentadecane, hexadecane, heptadecane, dodecene, tetradecene, hexadecene, heptadecene, octadecene, terpinenes, isoparaffinic solvents, and their isomers; an aromatic hydrocarbon having from about 7 carbon atoms to about 18 carbon atoms, such as toluene, xylene, ethyltoluene, mesitylene, trimethylbenzene, diethylbenzene, tetrahydronaphthalene, ethylbenzene, and their isomers and mixtures. Suitable alcohol can have at least 6 carbon atoms and can be, for example, hexanol, heptanol, octanol, nonanol, decanol, undecanol, dodecanol, tetradecanol, and hexadecanol; a diol such as hexanediol, heptanediol, octanediol, nonanediol, and decanediol; an alcohol including an unsaturated double bond, such as farnesol, dedecadienol, linalool, geraniol, nerol, heptadienol, tetradecenol, hexadeceneol, phytol, oleyl alchohol, dedecenol, decenol, undecylenyl alcohol, nonenol, citronellol, octenol, and heptenol; a cycloaliphatic alcohol with or without an unsaturated double bond, such as methylcyclohexanol, menthol, dimethylcyclohexanol, methylcyclohexenol, terpineol, dihydrocarveol, isopulegol, cresol, trimethylcyclohexenol; and the like. If two or more solvents are used, the solvents can be at any suitable ratio. For example, the hydrocarbon and the alcohol solvent can be a ratio from about 5:1 to about 1:5. Other solvents can include tetrahydrofuran; chlorobenzene; dichlorobenzene; trichlorobenzene; nitrobenzene; cyanobenzene; acetonitrile; and/or mixtures thereof.

In one embodiment, the liquid composition 20 can be prepared by, for example, preparing or providing stabilized silver-containing nanoparticles having the stabilizer molecules on the surface of the silver-containing nanoparticles, and dissolving or dispersing (assisted by, for example, ultrasonic and/or mechanical stirring) the prepared stabilized silver-containing nanoparticles in an appropriate liquid, an organic solvent or water The formed liquid composition can be suitable for forming conductive elements for electronic applications.

In various embodiments, the liquid composition 20 can include stabilized silver-containing nanoparticles present in an amount ranging, for example, from about 10% to about 90%, from about 15% to about 70%, or from about 25% to about 60%, by weight of total liquid composition 20. In embodiments, the liquid composition can be in any suitable form such as ink-jettable ink, flexographic ink, paste, gel, and the like.

In embodiments, the materials and methods used for the stabilized silver-containing nanoparticles and for the liquid compositions thereof can be similar or the same to those described in U.S. Pat. No. 7,270,694, entitled "stabilized Silver Nanoparticles and their Use," which is hereby incorporated by reference in its entirety.

Referring to FIGS. 1-1A, fabrication of highly conductive features or electrically conductive elements from the liquid composition 20 of stabilized silver-containing nanoparticles can be carried out by depositing the liquid composition 20 on the substrate 10 using a liquid deposition technique at any suitable time prior to or subsequent to the formation of other optional layer or layers on the substrate. Thus, liquid deposition of the liquid composition 20 on the substrate 10 can occur either on a substrate or on a substrate already containing layered material.

The term "liquid deposition technique" refers to deposition of a liquid composition using a liquid process such as liquid coating or printing, where the liquid composition is a solution or a dispersion. In embodiments, the liquid composition 20 of stabilized silver-containing nanoparticles can be referred to as an ink, when printing, particularly inkjet printing, is used. Exemplary printing techniques can include, for example, lithography or offset printing, gravure, flexography, screen printing, stencil printing, inkjet printing, stamping, microcontact printing, and the like.

As shown in FIG. 1B, the deposited or printed stabilized silver-containing nanoparticles can form one or more composition features 24 on the substrate 10. In various embodiments, the composition feature 24 at this stage may or may not exhibit appreciable electrical conductivity.

At 104 of FIG. 1A, and referring to FIG. 1B, the composition features 24 deposited from the liquid composition 20 can be subjected to a composition agent 30, such as an acidic composition. In embodiments, the application of composition agent 30 can include, for example, a liquid coating process, such as spin coating, blade coating, rod coating, dip coating, spray coating, and the like. The application of composition agent 30 can also include a printing technique, such as inkjet printing, flexographic printing, screen printing, micro-contact printing, and the like. In exemplary embodiments, the composition agent 30 can be applied by spray coating, which can include a continuous spray or a pulsed spray.

In various embodiments, the exemplary acidic composition can include an acidic atmosphere such as an acidic vapor or an acidic gas including an acid. In embodiments, the exemplary acidic composition can include a pure acid or an acid dissolved in a solvent.

In an exemplary embodiment, the acidic composition can be chosen to be bonded with the organoamine-stabilized silver-containing nanoparticles of the deposited composition features 24. For example, the exemplary acidic composition can include, such as carboxylic acid having 2 to about 20 carbon atoms including acetic acid, propionic acid, butyric acid, pentanoic acid, hexanoic acid, heptanoic acid, octanoic acid, nonanoic acid, decanoic acid, undecanoic acid, dodecanoic acid, tridecanoic acid, myristic acid, pentadecanoic acid, palmitic acid, heptadecanoic acid, stearic acid, oleic acid, nonadecanoic acid, icosanoic acid, eicosenoic acid, elaidic acid, linoleic acid, palmitoleic acid, citronellic acid, geranic acid, undecenoic acid, lauric acid, undecylenic acid, isomers thereof, and mixtures thereof inorganic acid such as HCl, $HNO_3$, $H_2SO_4$, $HPO_3$, and the like. The solvent used to form the exemplary acidic composition can include, for example, water, alcohol, ketone, ether, and the like. In embodiments, the acidic composition can have a pKa value from about −11 to about 5, including from about 0.5 to about 5.

In embodiments, as compared with conventional two-step process that includes a depositing step and a heating step for forming highly conductive features, the disclosed processes can include the additional step 104 of applying the composition agent 30 to the composition feature 10.

While not intending to be bound by any particular theory, it is believed that the chemical and/or physical interaction between the composition agent 30 (e.g., acidic composition) and the stabilizer (e.g., organoamine) on surface of the silver-containing nanoparticles can create "weak" stabilization sites, such that adjacent nanoparticles can be fused or grown together through these weak sites at a reduced heating temperature for the heating step 106.

The reduced temperature can be a temperature of at least about 10° C. lower than the heating temperature used in the conventional two-step processes without using any composition agents. However, the electrical conductivity of highly conductive features formed from both the conventional and the disclosed processes can be substantially similar when the same formation system is used.

In various embodiments, the composition agent 30 can include any agent that can provide the weak sites on silver-containing nanoparticles. For example, a base can be used for the composition agent 30, when the stabilized silver-containing nanoparticles are stabilized by acid such as carboxylic acid. The base including, for example, $NH_4OH$, or NaOH, can react with the exemplary carboxylic acid stabilizer to generate weak sites on the nanoparticle surfaces, such that a reduced or lower annealing or heating temperature can be used in the following heating step to form highly conductive features.

At 106 of FIG. 1A, and referring to FIG. 1B, the deposited composition features 24 on the substrate 10 can be heated or annealed at a temperature of about 140° C. or less following the treatment of the composition agent 30. Highly conductive features 40 can then be formed on the substrate 10.

As used herein, the term "heating" or "annealing" encompasses any technique(s) that can impart sufficient energy to a material to cause the desired result such as thermal heating (e.g., a hot plate, an oven, and a burner), infra-red ("IR") radiation, microwave radiation, or UV radiation, or a combination thereof.

Heating the deposited composition features 24 at a temperature of, for example, below about 140° C. or below about 120° C., can cause the composition features 24 to form the electrically conductive features 40 that each includes the silver-containing nanoparticles. Such heating temperatures can be chosen not to cause adverse changes in the properties of previously deposited and/or agent treated composition feature 20/24 along with the underlying substrate 10.

The heating can be performed for a time ranging from, for example, 1 second to about 10 hours and from about 10 seconds to 1 hour. The heating can be performed in air, in an inert atmosphere, for example, under nitrogen or argon, or in a reducing atmosphere, for example, under nitrogen containing from 1 to about 20 percent by volume hydrogen. The heating can also be performed under normal atmospheric pressure or at a reduced pressure of, for example, from about 1000 mbars to about 0.01 mbars. In embodiments, the heating is performed in air at the normal atmospheric pressure.

The heating at 106 can produce a number of effects. Prior to heating, composition feature 24 may be electrically insulating or with very low electrical conductivity, but heating can result in the highly conductive feature 40 of annealed silver-containing nanoparticles which increases the conductivity. In embodiments, the annealed silver-containing nanoparticles can be coalesced or partially coalesced silver-containing nanoparticles In embodiments, it is possible that in the annealed silver-containing nanoparticles, the silver-containing nanoparticles can achieve sufficient particle-to-particle contact to form the electrically conductive layer without coalescence.

The heating at 106 can cause separation of the stabilizer and/or the liquid (such as solvent for the liquid composition 20) from the silver-containing nanoparticles in the sense that the stabilizer and the liquid are generally not incorporated into the electrically conductive feature 40 but if present are in residual quantities. In embodiments, such separation may occur in any manner such as for example a change in state of matter from a solid or liquid to a gas, e.g., volatilization.

In embodiments, various steps described above for preparing the disclosed highly conductive features 40 in FIG. 1A and FIG. 1B may be added, omitted, combined, altered, or performed in different orders. For example, the step 104 of applying the composition agent 30 to the deposited features on the substrate 10 can be performed at any time, for example, after the depositing step at 102 but prior to the heating step 106 as shown in FIG. 1B, during the depositing step at 102 (see FIG. 1C), and/or during the heating step 106 (see FIG. 1D).

Specifically, as shown in FIG. 1C, the step 104 of applying the composition agent 30 can be performed along with the deposition of the liquid composition 20 at step 102 onto the substrate 10. The heating step at 106 can then be performed to form highly conductive features 40 on the substrate 10.

In another example, as shown in FIG. 1D, following the deposition step 102 of depositing liquid composition 20 into composition features 24 on the substrate 10, the step 104 of applying the composition agent 30 can be performed along with the heating step 106.

EXAMPLES

Example 1

Control Sample Processed with No Composition Agent Involved

Hexyldecane amine stabilized silver-containing nanoparticles were used for both the control samples and the disclosed conductive samples. Liquid compositions of control samples were prepared to include 15 wt % of the hexyldecane amine stabilized silver-containing nanoparticles in a toluene solvent and were spin-coated on glass slides as exemplary substrates. The coated materials were annealed on a hotplate for about 10 minutes at each temperature of about 110° C., 120° C., and 140° C. During this control sample formation, no composition agent was applied to treat the coated or annealed samples.

Conductivity of the formed control samples was measured using conventional four-probe method. The conductivities of control samples were about $4.1 \times 10^{-4}$, $4.8 \times 10^{-2}$, and $3.9 \times 10^{4}$ S/cm, when the annealing temperature is respectively about 110° C., 120° C., and 140° C. Such results clearly showed that, annealing at temperatures of about 110° C. and about 120° C. exhibited undesirable conductivity to the control samples where no composition agent was used. A high annealing temperature of at least about 140° C. was needed to achieve desirable high conductivity, e.g., about $3.9 \times 10^{4}$ S/cm.

Example 2

Highly Conductive Film Sample Treated by Acetic Acid when Annealing

The processes and materials of Example 1 were also used in this example. The liquid compositions of Example 1 were spin-coated on glass slides and were annealed on a hotplate at about 100° C. and about 110° C. for about 10 minutes. During annealing, acetic acid was used as the disclosed composition agent and was sprayed into the air on top of the annealed film sample. As a result, the conductivity of the film sample annealed at 110° C. was measured of about $2.37 \times 10^{4}$ S/cm, which is more than 7 orders of magnitude higher than its control sample of Example 1. The annealing temperature was lowered by 30° C. using this method, due to the application of the exemplary acetic acid when annealing.

Example 3

Highly Conductive Film Sample Treated by HCl when Annealing

As compared with Example 2, a second exemplary acidic composition, hydrochloric acid (HCl) (36.5 wt %), was applied (e.g., sprayed) by a few drops into the air beside the hotplate during the annealing step. The resulting film sample showed a conductivity of about 3970 S/cm at 100° C. and about $5.68 \times 10^{4}$ S/cm at 110° C., indicating that the processing temperature can be reduced to as low as about 100° C.

Figure 2:
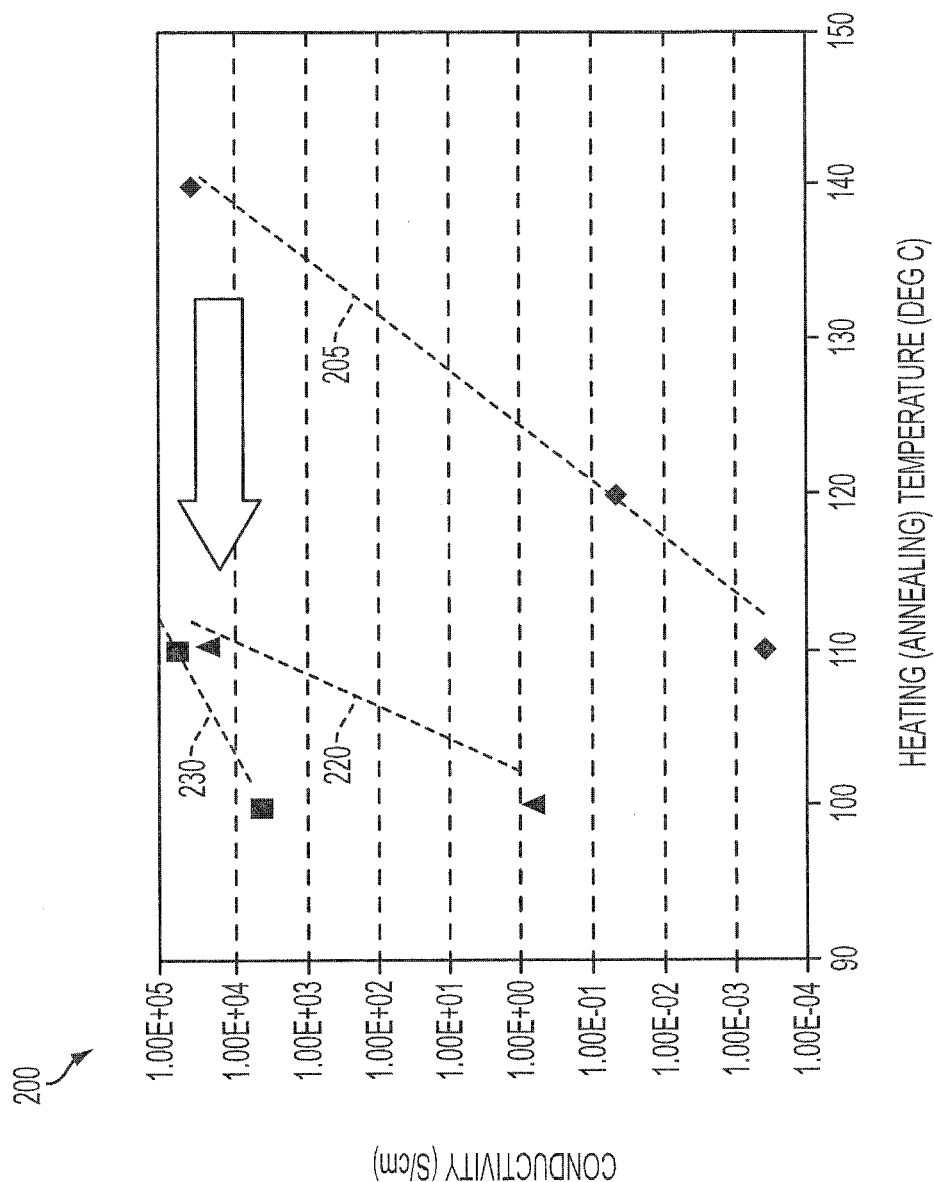
FIG. 2 depicts conductivity comparisons between a control sample and various disclosed conductive samples in accordance with various embodiments of the present teachings.

FIG. 2 depicts an exemplary conductivity comparison between the control sample 215 of Example 1, the conductive film sample 220 of Example 2, the conductive film sample 230 of Example 3 in accordance with various embodiments of the present teachings. As indicated in FIG. 2, in order to obtain a high conductivity, for example, of about $1 \times 10^{4}$ S/cm, the control sample 205 needs a heating or annealing temperature of higher than about 140° C., the conductive sample 220 treated by acetic acid needs a heating temperature of as low as about 110° C., and the conductive sample 230 treated by HCl needs a heating temperature of as low as about 105° C.

Example 4

Highly Conductive Film Sample Treated by HCl Prior to the Annealing

Similar to Example 3, HCl vapor was used. Different from Example 3, the HCl vapor was applied before annealing the deposited liquid composition for about 1-2 minutes, followed by an annealing process at about 110° C. on hotplate for about 10 minutes. The conductivity was then measured to be about $3.5 \times 10^{4}$ S/cm, showing the exposure to acid can be performed before the annealing, where a low annealing temperature can be used to provide a desirable high conductivity.

Example 5

Jet-ink Printed Highly Conductive Line Features

In this example, the liquid compositions of Examples 1-4 were formulated into jettable ink and printed onto glass slides to form conductive fine features including line feature having a width of about 60 μm. Acetic acid was sprayed on top of the printed composition features. The acid treated features were then annealed at about 110° C. for about 10 minutes. As a result, the printed lines became highly conductive, and the acid spreading did not damage the printed features.

While the present teachings have been illustrated with respect to one or more implementations, alterations and/or modifications can be made to the illustrated examples without departing from the spirit and scope of the appended claims. In addition, while a particular feature of the present teachings may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." As used herein, the term "one or more of" with respect to a listing of items such as, for example, A and B, means A alone, B alone, or A and B. The term "at least one of" is used to mean one or more of the listed items can be selected.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements, Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g. 1 to 5. In certain cases, the numerical values as stated for the parameter can take on negative values. In this case, the example value of range stated as "less than 10" can assume values as defined earlier plus negative values, e.g. −1, −1.2, −1.89, −2, −2.5, −3, −10, −20, −30, etc.

Other embodiments of the present teachings will be apparent to those skilled in the art from consideration of the specification and practice of the present teachings disclosed herein. It is intended that the specification and examples be considered as exemplary only, with a true scope and spirit of the present teachings being indicated by the following claims.

What is claimed is:

1. A method for forming a conductive feature comprising:
   depositing a liquid composition comprising a plurality of organoamine-stabilized silver-containing nanoparticles into a composition feature on a substrate;
   heating the composition feature to a temperature of less than 140° C. to form a conductive feature; and
   applying a liquid acidic composition agent to the composition feature to allow for the temperature of less than 140° C. for the heating step, wherein the composition agent is applied during the heating step and after all deposition of the liquid composition for forming the conductive feature has been completed.

2. The method of claim 1, wherein the heating is performed at the temperature of about 120° C. or lower.

3. The method of claim 1, wherein the organoamine is selected from the group consisting of butylamine, pentylamine, hexylamine, heptylamine, octylamine, nonylamine, decylamine, hexadecylamine, undecylamine, dodecylamine, tridecylamine, tetradecylamine, diaminopentane, diaminohexane, diaminoheptane, diaminooctane, diaminononane, diaminodecane, diaminooctane, dipropylamine, dibutylamine, dipentylamine, dihexylamine, diheptylamine, dioctylamine, dinonylamine, didecylamine, hexyldecane amine, methylpropylamine, ethylpropylamine, propylbutylamine, ethylbutylamine, ethylpentylamine, propylpentylamine, butylpentylamine, tributylamine, trihexylamine, and mixtures thereof.

4. The method of claim 1, wherein the composition agent comprises an acidic composition selected from the group consisting of carboxylic acid, HCl, $HNO_3$, $H_2SO_4$, and $HPO_3$.

5. The method of claim 1, wherein the plurality of silver-containing nanoparticles comprises elemental silver or a silver composite.

6. The method of claim 1, wherein the plurality of stabilized silver-containing nanoparticles is present in an amount from about 10% to about 90% by weight of the total liquid composition.

7. The method of claim 1, wherein the substrate comprises glass, polyimide, poly(ethylene naphthalate) (PEN), or polyethylene terephthalate (PET).

8. The method of claim 1, further comprising applying the composition agent to the composition feature by printing or coating.

9. A method for forming a conductive feature comprising:
   depositing a liquid composition comprising a plurality of organoamine-stabilized silver-containing nanoparticles into a composition feature on a substrate;
   heating the composition feature at a temperature of less than 140° C.; and applying a liquid acidic composition agent to the composition feature to form a conductive feature; wherein the acidic composition agent is applied at a step selected from the group consisting of the depositing step, a step after the depositing step but prior to the heating step, and the heating step, wherein if the acidic composition agent is applied during the deposition step, the acidic composition agent is applied from a composition that is separate from the liquid composition, and further wherein if the acidic composition agent is applied either during the heating step or after the deposition step but prior to heating, then the acidic composition agent is applied after all deposition of the liquid composition for forming the conductive feature has been completed.

10. The method of claim 9, wherein the organoamine is selected from the group consisting of butylamine, pentylamine, hexylamine, heptylamine, octylamine, nonylamine, decylamine, hexadecylamine, undecylamine, dodecylamine, tridecylamine, tetradecylamine, diaminopentane, diaminohexane, diaminoheptane, diaminooctane, diaminononane, diaminodecane, diaminooctane, dipropylamine, dibutylamine, dipentylamine, dihexylamine, diheptylamine, dioctylamine, dinonylamine, didecylamine, hexyldecane amine, methylpropylamine, ethylpropylamine, propylbutylamine, ethylbutylamine, ethylpentylamine, propylpentylamine, butylpentylamine, tributylamine, trihexylamine, and mixtures thereof.

11. The method of claim 9, wherein the organoamine is present in an amount from about 5% to about 60% by weight of the total organoamine-stabilized silver-containing nanoparticles.

12. The method of claim 9, wherein applying the acidic composition agent to the composition feature forms a network, a complex, or a salt with the organoamine of the plurality of organoamine-stabilized silver-containing nanoparticles.

13. The method of claim 9, wherein the acidic composition agent comprises an acid having a pKa from about 0.5 to about 5.

14. The method of claim 9, wherein the acidic composition agent is applied at a step selected from the group consisting of a step after the depositing step but prior to the heating step and the heating step.

15. The method of claim 9, wherein the substrate is flexible.

16. A method for forming a conductive feature comprising:
    depositing a liquid composition comprising a plurality of organoamine-stabilized silver-containing nanoparticles into one or more composition features on a substrate, the substrate comprising PET (polyethylene terephthalate);
    annealing the one or more composition features at a temperature of about 120° C. or lower; and
    applying a liquid acidic composition agent to the one or more composition features to form one or more conductive features, wherein the acidic composition agent is applied at a step selected from the group consisting of the depositing step, a step after the depositing step but prior to the heating step, and the heating step, wherein if the acidic composition agent is applied during the deposition step, the acidic composition agent is applied from a composition that is separate from the liquid composition, and further wherein if the acidic composition agent is applied either during the heating step or after the deposition step but prior to heating, then the acidic composition agent is applied after all deposition of the liquid composition for forming the conductive feature has been completed.

17. A method for forming a conductive feature comprising:
    depositing a liquid composition comprising a plurality of acid-stabilized silver-containing nanoparticles into a composition feature on a substrate;
    heating the composition feature to a temperature of less than 140° C. to form a conductive feature; and
    applying a base composition agent to the composition feature, the base reacting with the acid stabilizer to allow for the temperature of less than 140° C. for the heating step, wherein the composition agent is applied at a step selected from the depositing step, a step after the depositing step but prior to the heating step, and the heating step, wherein if the base composition agent is applied during the deposition step, the base composition agent is applied from a composition that is separate from the liquid composition, and further wherein if the base composition agent is applied either during the heating step or after the deposition step but prior to heating, then the base composition agent is applied after all deposition of the liquid composition for forming the conductive feature has been completed.

18. The method of claim 17, wherein the composition agent comprises NaOH, or $NH_4OH$.

19. The method of claim 17, wherein the base composition agent is applied at a step selected from the group consisting of a step after the depositing step but prior to the heating step and the heating step.

20. The method of claim 17, wherein the base composition agent is applied during the heating step.

* * * * *